United States Patent
Padaparambil

(10) Patent No.: US 7,392,334 B2
(45) Date of Patent: Jun. 24, 2008

(54) CIRCUITS AND METHODS FOR HIGH SPEED AND LOW POWER DATA SERIALIZATION

(75) Inventor: Muralikumar A. Padaparambil, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 389 days.

(21) Appl. No.: 11/333,715

(22) Filed: Jan. 17, 2006

(65) Prior Publication Data

US 2007/0168589 A1 Jul. 19, 2007

(51) Int. Cl.
G06F 13/12 (2006.01)
G06F 3/00 (2006.01)

(52) U.S. Cl. .............................. 710/71; 710/29; 710/33; 710/36

(58) Field of Classification Search ........................ None
See application file for complete search history.

(56) References Cited

U.S. PATENT DOCUMENTS 5,055,842 A 10/1991 Mueller
5,414,830 A * 5/1995 Marbot .......................... 710/71
6,417,790 B1 7/2002 Fiedler et al.
6,741,193 B2 5/2004 Nagata
6,771,194 B2 8/2004 Shi
6,867,716 B2 3/2005 Zhang
6,937,173 B2 8/2005 Kim

* cited by examiner

Primary Examiner—Alan S. Chen

(57) ABSTRACT

Circuits and methods convert parallel data into a serial data stream. A serializer according to the present invention generally includes a high speed section and a low speed section. The high speed section generally comprises a tree-based serializer configured to serialize an N-bit parallel data stream, where N is a power of two. The low speed section generally includes a data bank configured to load one or more samples of an M-bit parallel input stream, and a multiplexer configured to produce the N-bit parallel data stream from the data bank. The present invention advantageously provides high speed and relatively low power serialization of M-bit parallel data streams where M is not a power of two. In particular, the present invention advantageously provides high speed and relatively low power serialization of 10-bit parallel data streams.

20 Claims, 5 Drawing Sheets

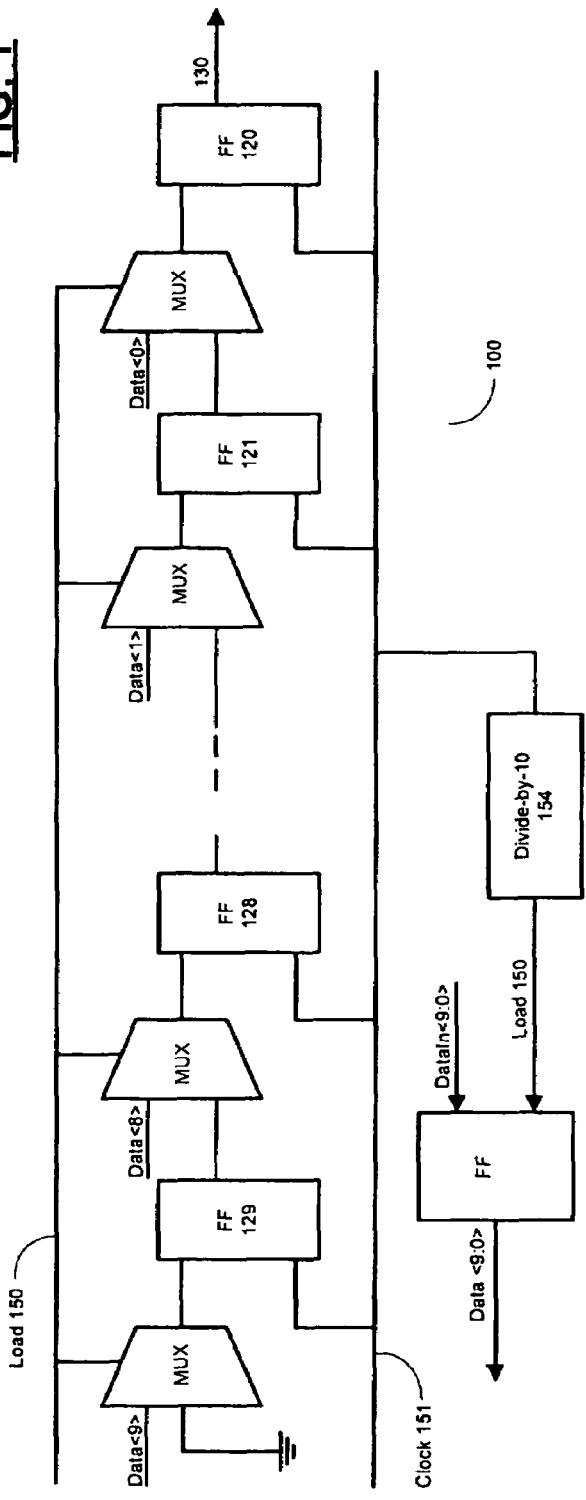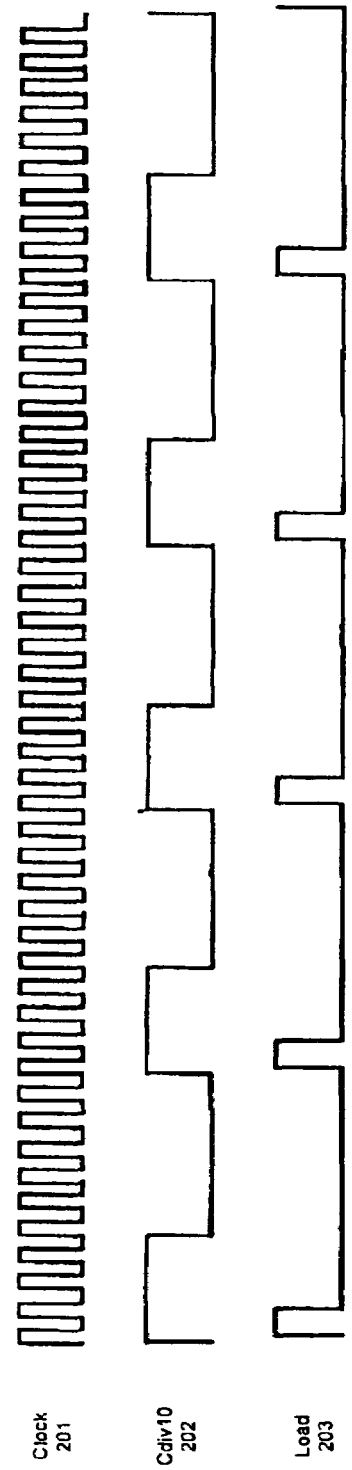

CIRCUITS AND METHODS FOR HIGH SPEED AND LOW POWER DATA SERIALIZATION

FIELD OF THE INVENTION

The present invention generally relates to the field of high speed data communications. More specifically, embodiments of the present invention pertain to circuits and methods for high speed and low power serialization of parallel data.

DISCUSSION OF THE BACKGROUND

Serializers (also known as parallel-to-serial converters or parallel-in serial-out [PISO] circuits) are widely used in data communication systems to convert parallel data into a serial data stream. Serializers are important components in communication network transmissions. A serializer converts a relatively low speed parallel data stream into a relatively high speed serial data stream. Since such a circuit produces high speed serial data, it consumes a significant amount of power in a serial communication network. Improvements made to reduce the power consumed by such a circuit will generally reduce the power consumed by serial communication network equipment.

Serial communication systems often employ an 8b/10b encoding scheme. 8b/10b encoding encodes 8-bit data into 10 bits. The encoding generally improves the physical signal and facilitates bit synchronization, error detection, and control character (i.e., the Special Character) encoding. 8b/10b encoding is used in high speed data communication protocols including Fibre Channel, Gigabit Ethernet, 10 Gigabit Ethernet, and ATM transmission interfaces. An 8b/10b encoder typically provides a 10-bit parallel output. Therefore, serializers used in such systems generally must serialize 10-bit parallel data.

FIG. 1 shows a conventional parallel load and shift register circuit 100 for serializing 10-bit parallel data. This circuit loads the 10-bit parallel data during the first clock cycle and then shifts the data for the next 9 clock cycles. Output 130 of last flip-flop 120 thereby produces a serial data stream corresponding to the parallel input data.

FIG. 2 shows a timing diagram corresponding to serializer circuit 100 of FIG. 1. When load signal 203 is high, circuit 100 loads a sample of the 10 bit parallel input stream (e.g., Data<0:9>) into flip-flops 120 to 129. When the load signal is low, the flip-flops are connected as a shift register. Thus, during 10 clock cycles, 10 bits are shifted out of the last flip-flop, generating the serialized data stream. Serializer 100 also includes divider 154 configured to generate a divide-by-10 signal (e.g., signal 202 of FIG. 2) and a load signal 150 (e.g., signal 203 of FIG. 2). Divider 154 generally runs at the clock frequency. A divide-by-10 divider typically employs 4 flip-flops, so serializer circuit 100 typically requires 14 flip-flops (10 flip-flops 120-129 in the data-path, and 4 flip-flops in divider 154) operating at the clock frequency. The power dissipated by the switching of the clock signal generally contributes a majority of the power consumed in such a circuit. Therefore, average power dissipated by the clock signal $P_s$ may be calculated according to the equation:

$$P_s = 10 * CV^2 f + 4 * CV^2 f \qquad (1)$$
$$= 14 * CV^2 f;$$

where C is the input capacitance of the clock pin of the flip-flop,
V is the power supply voltage, and
f is the clock frequency.

A similar equation can be derived for an 8-bit parallel load and shift serializer:

$$P_s = 8 * CV^2 f + 3 * CV^2 f \qquad (2)$$
$$= 11 * CV^2 f.$$

A tree-based serializer generally dissipates or consumes less power than a conventional parallel load and shift serializer. FIG. 3 shows conventional tree-based serializer circuit 300, which includes MUX 311 operating at half clock frequency (Cdiv2), and MUXs 312 and 313 operating at $\frac{1}{4}^{th}$ of clock frequency (Cdiv4). In circuit 300, only the last flip-flop 301 operates at the clock frequency (Clock). Flip-flops 302 and 303, in the previous stage, work at Cdiv2. By extension of the 4-bit serializer shown in FIG. 3, an 8-bit serializer may have one flip-flop (e.g., flip flop 301) operating at clock frequency (Clock), two flip-flops (e.g., flip-flops 302 and 303) operating at half clock frequency (Cdiv2), and 4 flip-flops (not shown in 4-bit serializer 300) operating at $\frac{1}{4}^{th}$ of clock frequency (Cdiv4). In the dividers (e.g. divide-by-2 dividers 320 and 321) one flip-flop operates at clock frequency (Clock), one at half clock frequency (Cdiv2), and another at $\frac{1}{4}^{th}$ of clock frequency (Cdiv4). Therefore, average power dissipated by the clock signal, $P_t$ may be calculated according to the equation:

$$P_t = CV^2 f + (2 * C_1 V^2 f / 2) + (4 * C_1 V^2 f / 4) + \qquad (3)$$
$$CV^2 f + CV^2 f / 2 + CV^2 f / 4$$
$$= (2.75 * CV^2 f) + (2 * C_1 V^2 f);$$

where C is the input capacitance of the clock pin of the flip-flop,
$C_1$ is the sum of C plus the capacitance of the select pin of the multiplexer (normally $C_1 < 2*C$),
V is the power supply voltage, and
f is the clock frequency.

The first three terms in Equation (3), $(CV^2 f + (2*C_1 V^2 f/2) + (4*C_1 V^2 f/4))$ correspond to the clock power dissipated in the tree-based serializer. The last three terms of Equation (3), $(CV^2 f + CV^2 f/2 + CV^2 f/4)$, correspond to the clock power dissipated in the divider. Comparing the average power dissipation of an 8-bit parallel load and shift serializer to the average power dissipation of an 8-bit tree-based serializer, the tree-based serializer architecture reduces average power dissipated by between 40% (in the worst case, when $C_1 = 2*C$) and 55% (in the best case, when $C_1 = C$). Unlike the parallel load and shift serializer, the tree-based serializer includes only one flip-flop operating at the clock frequency in the data path. In addition to improved power consumption, this feature reduces constraints (e.g., timing constraints) on the circuit layout of the tree-based serializer, in comparison to the parallel load and shift serializer.

A tree-based serializer, however, generally requires parallel input data of $2^r$ bits, where r is an integer of at least 1 (e.g., 2 bits, 4 bits, 8 bits, 16 bits, etc.). As described above, many digital communication systems demand serializers for 10-bit parallel data. Thus, a conventional tree-based serializer cannot be used, because 10 is not a power of two. Therefore it is desirable to provide high speed and relatively low power serialization of M-bit parallel data streams, where M is not a power of two.

SUMMARY OF THE INVENTION

Embodiments of the present invention relate to circuits and methods for converting parallel data into a serial data stream. A serializer according to the present invention generally includes a high speed section and a low speed section. The high speed section generally comprises a tree-based serializer configured to serialize an N-bit parallel data stream, where N is a power of two. The low speed section generally includes a data bank configured to load one or more samples of an M-bit parallel input stream, and a multiplexer configured to produce the N-bit parallel data stream from the data bank.

The circuit generally comprises (a) a data bank of M*y data bits, where y is an integer of at least 1, where the data bank is configured to load y sequential samples of an M-bit parallel input stream, (b) a multiplexer configured to receive the data bits and to produce an N-bit parallel data stream, where $N=2^r$, r is an integer of at least 1, M*y=N*z, and z is an integer of at least 1, and (c) a tree-based serializer with r stages, configured to receive the N-bit parallel data stream and to produce a corresponding serial data stream. In a preferred embodiment, the circuit comprises a data bank of 20 data bits, configured to load two sequential samples of a 10-bit parallel input stream, a multiplexer configured to receive the data bits and to produce a 4-bit parallel data stream, and a tree-based serializer with two stages, configured to receive the 4-bit parallel data stream and to produce a corresponding serial data stream. The method generally includes the steps of (i) loading an M-bit parallel input stream into a data bank of M*y bits, (ii) producing an N-bit parallel data stream, where $N=2^r$, r is an integer of at least 1, M*y=N*z, and z is an integer of at least 1, and (iii) serializing z sequential samples of the N-bit parallel data stream in a tree-based serializer with r stages.

The present invention advantageously provides serialization of M-bit parallel input streams, with low power requirements even where M is not a power of two. In particular, the present invention advantageously provides high speed and relatively low power serialization of 10-bit parallel input streams.

These and other advantages of the present invention will become readily apparent from the detailed description of preferred embodiments below.

BRIEF DESCRIPTION OF THE DRAWINGS

FIG. 1 is a diagram showing a conventional parallel load and shift serializer.

FIG. 2 is a timing diagram of a conventional parallel load and shift serializer.

DETAILED DESCRIPTION OF THE PREFERRED EMBODIMENTS

Figure 3:
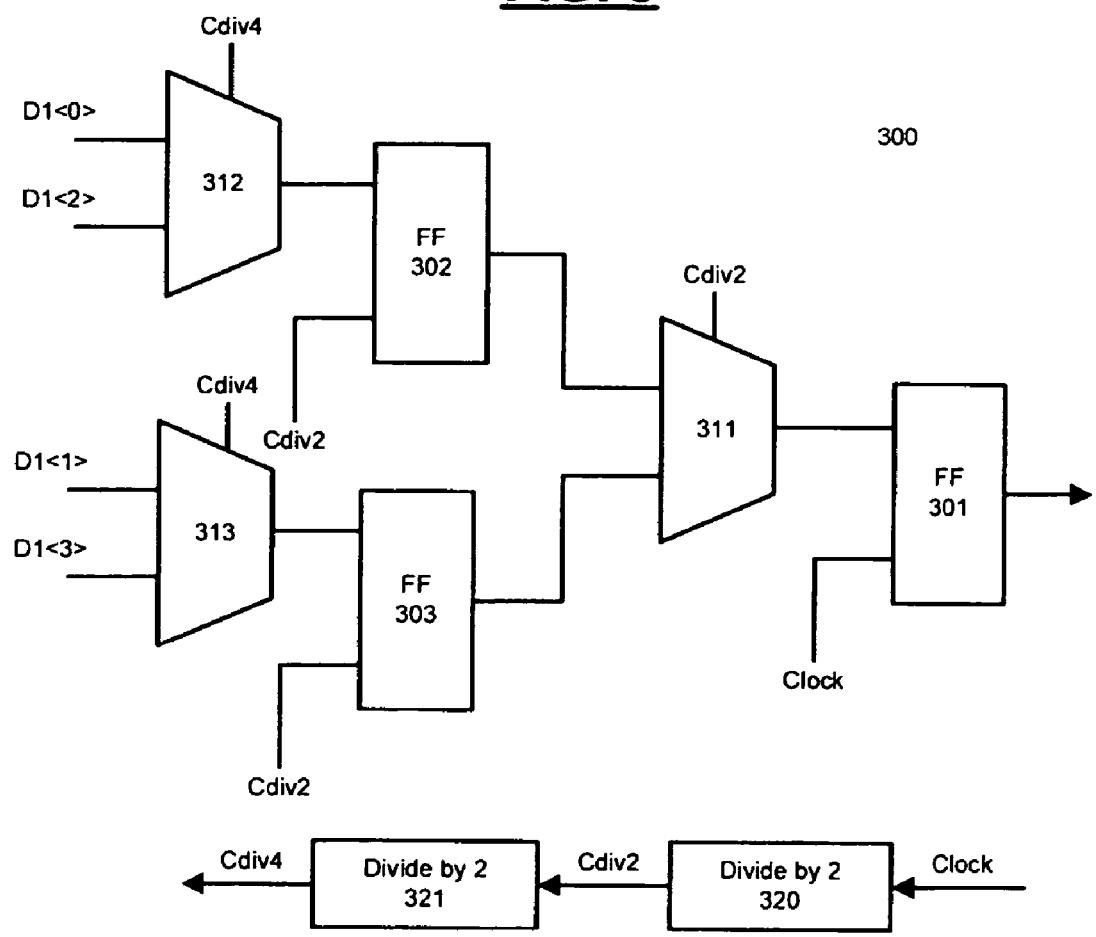
FIG. 3 is a diagram showing a conventional 4-bit tree-based serializer.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "connected to," "coupled with," "coupled to," and "in communication with," which terms also refer to direct and/or indirect relationships between the connected, coupled and/or communication elements unless the context of the term's use unambiguously indicates otherwise, are generally used interchangeably herein, but are generally given their art-recognized meanings.

The present invention concerns circuits and methods for converting parallel data into a serial data stream. The circuit generally comprises (a) a data bank of M*y data bits, where y is an integer of at least 1, where the data bank is configured to load y sequential samples of an M-bit parallel input stream, (b) a multiplexer configured to receive the data bits and to produce an N-bit parallel data stream, where $N=2^r$, r is an integer of at least 1, M*y=N*z, and z is an integer of at least 1, and (c) a tree-based serializer with r stages, configured to receive the N-bit parallel data stream and to produce a corresponding serial data stream. In a preferred embodiment, the circuit comprises a data bank of 20 data bits, configured to load two sequential samples of a 10-bit parallel input stream, a multiplexer configured to receive the data bits and to produce a 4-bit parallel data stream, and a tree-based serializer with two stages, configured to receive the 4-bit parallel data stream and to produce a corresponding serial data stream. The method generally includes the steps of (i) loading an M-bit parallel input stream into a data bank of M*y bits, (ii) producing an N-bit parallel data stream, where $N=2^r$, r is an integer of at least 1, M*y=N*z, and z is an integer of at least 1, and (iii) serializing z sequential samples of the N-bit parallel data stream in a tree-based serializer with r stages.

The invention, in its various aspects, will be explained in greater detail below with regard to exemplary embodiments.

An Exemplary Circuit

In one aspect, the present invention relates to a circuit for converting an M-bit parallel input stream into a corresponding serial data stream with a periodic frequency f. The circuit generally comprises (a) a data bank of M*y data bits, where y is an integer of at least 1, where the data bank is configured to load y sequential samples of the M-bit parallel input stream, (b) a multiplexer configured to receive the data bits and to produce an N-bit parallel data stream, where $N=2^r$, r is an integer of at least 1, M*y=N*z, and z is an integer of at least 1, and (c) a tree-based serializer with r stages, configured to receive the N-bit parallel data stream and to produce a corresponding serial data stream.

It will be recognized that several approaches may be taken to factor the M-bit parallel input into N-bit segments suitable for input to a tree-based serializer, where N is a power of two. It is particularly desirable to do so for 10-bit parallel input. For example, M may be at least 3, 5, 6, 10, or other integer that is not a power of two. Preferably, M is greater than N. In a preferred embodiment, M may be 10, y may be 2, N may be 4, and z may be 5. In other words, in such an embodiment the data bank may be configured to load two (y=2) sequential samples of 10 parallel bits, to store a total of 20 bits. The multiplexer may produce a 4-bit (N=4) parallel output stream, to be serialized by a tree-based two stage (r=2) serializer.

In another exemplary embodiment, M may be 10, y may be 1, N may be 2, and z may be 5. Thus, the data bank may be configured to load a single sample of a 10-bit parallel input stream. The multiplexer may produce a 2-bit (N=2) parallel output stream, to be serialized by a one stage (N=2=2r=$2^1$) tree-based serializer.

In an alternative exemplary embodiment, M may be 10, y may be 4, N may be 8, and z may be 5. Thus, the data bank may be configured to load four (y=4) sequential samples of the 10-bit parallel input stream, to store a total of 40 bits. The multiplexer may produce an 8-bit (N=8) parallel output stream, to be serialized by a three stage (N=8=2r=$2^3$) tree-based serializer.

Generally, M may be any integer of at least 3 that is not a power of two, such as 3, 5, 6, or 10. For example, conventional encoders such as 4B/5B, 5B/6B, and 8B/10B encoders generally produce 5, 6, and 10-bit parallel data streams, respectively, which may be serialized by embodiments of the circuit according to the present invention. N may generally be any number that is a power of two, such as 2, 4, or 8. It is within the abilities of those skilled in the art to determine appropriate values of y and z, given a particular value of M, design choices, design or application constraints, and/or choice of an advantageous or optimal value of N.

While many more combinations of data bank and tree serializer size are possible, it will be recognized that there will be tradeoffs between the area and power saved by using the combined architecture, and the additional area and power consumed by the additional flip-flops and/or other components used in the data bank.

A serializer with an output data stream with periodic frequency f generally requires an M-bit parallel input stream with a periodic frequency of f/M. Therefore in a further embodiment the data bank may be configured to load samples of the M-bit parallel input stream at a frequency of f/M. In another embodiment, the multiplexer may be configured to load the data bits as often as the data bank is filled, i.e. at frequency of f/(M*y). In yet another embodiment the multiplexer may be configured to produce the N-bit parallel data stream at a frequency of f/N.

In another embodiment, the serializer circuit further comprises a clock signal operating at the periodic frequency f of the output serial data stream. The circuit may further comprise (a) first to r-th sequentially coupled divide-by-two dividers, with the first divider coupled to the data-speed clock, and (b) a divide-by-z divider with an input coupled to the r-th divide-by-two divider.

In another embodiment, each stage of the tree-based serializer may be labeled s, such that $0 \leq s < r$ (e.g., a two stage serializer has stages 0 . . . 1, a three stage serializer has stages 0 . . . 2, etc.). Each stage of the tree-based serializer may comprise $2^s$ two-to-one multiplexers and $2^s$ flip-flops. In a further embodiment, each of these $2^s$ flip-flops may operate at a frequency of $f/2^s$.

Serializers according to the present invention generally have components operating at a range of frequencies (e.g., the data bank and multiplexer generally operate at a lower frequency than components of the tree-based serializer, such as the stage 0 flip-flops). Thus, in a further embodiment the tree-based serializer may comprise higher speed logic components, such as current-mode logic (CML) components, while the lower speed data bank and multiplexer may comprise lower speed conventional full-swing CMOS components.

An Exemplary Implementation

Figure 4:
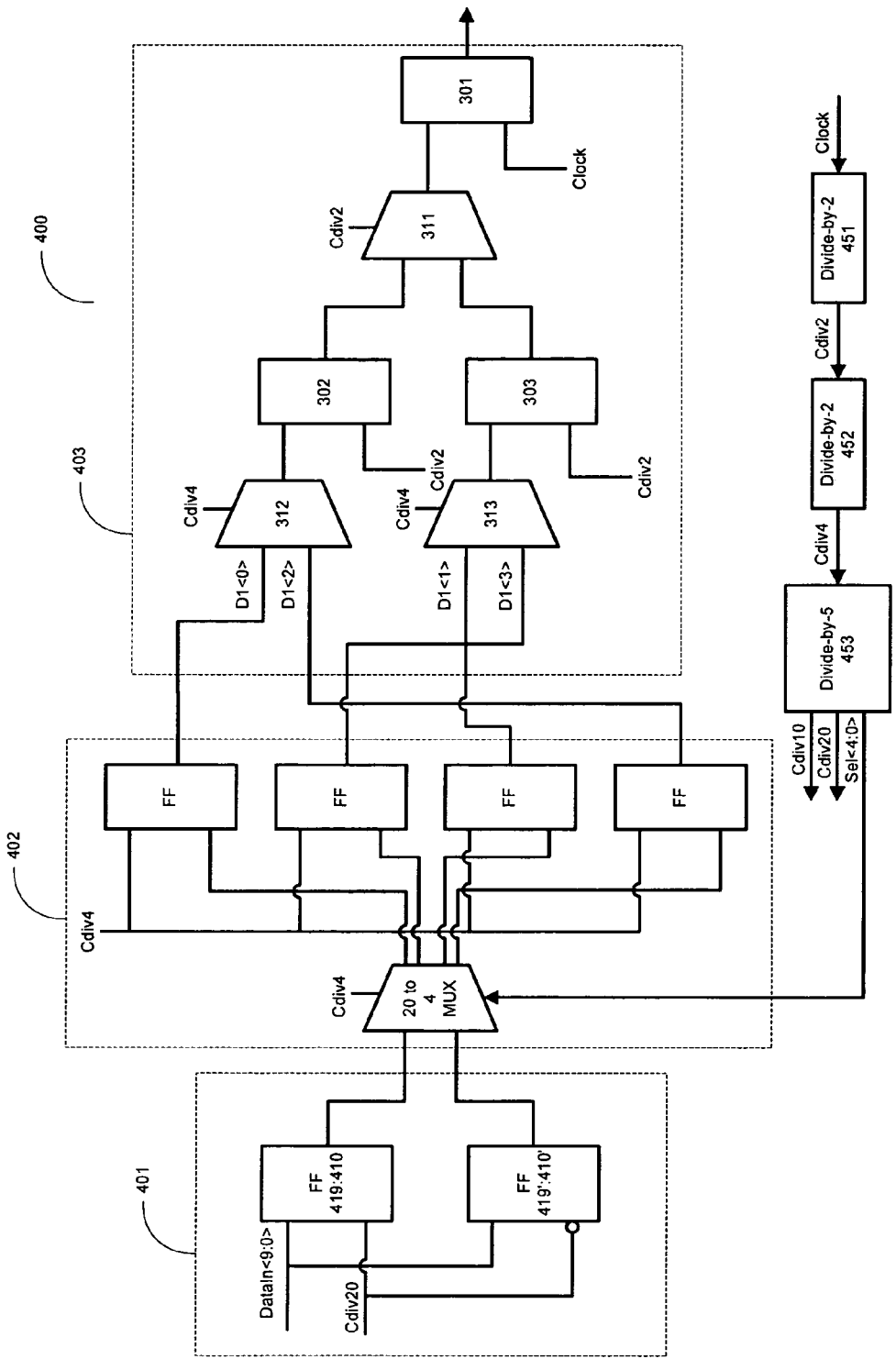
FIG. 4 is a diagram showing an implementation of a serializer according to the present invention.

In a preferred implementation, as shown in FIG. 4, the invention relates to a circuit 400 for converting a 10-bit parallel input stream into a corresponding data stream, where the data stream has periodic frequency f. The circuit may comprise a data bank of 20 data bits, configured to load two sequential samples of a 10-bit parallel input stream, a multiplexer configured to receive the data bits and to produce a 4-bit parallel data stream, and a tree-based serializer with two stages, configured to receive the 4-bit parallel data stream and to produce a corresponding serial data stream.

Furthermore, the multiplexer may be configured to produce five sequential samples of the 4-bit parallel data stream. In addition, the circuit may comprise (a) first and second sequentially coupled divide-by-two dividers, where the first divider is coupled to a data-speed clock, and (b) a divide-by-S divider with an input coupled to the second divide-by-two divider.

Referring now to FIG. 4, an exemplary embodiment of the present invention is shown. Data bank 401 is generally configured to load two samples of the 10-bit parallel input stream (e.g., DataIn<9:0>) to store 20 bits of data. Multiplexer 402 is generally configured to produce a 4-bit parallel data stream. Tree-based serializer 403 is generally configured to serialize the 4-bit parallel data stream to produce a corresponding serial data stream.

Figure 5:
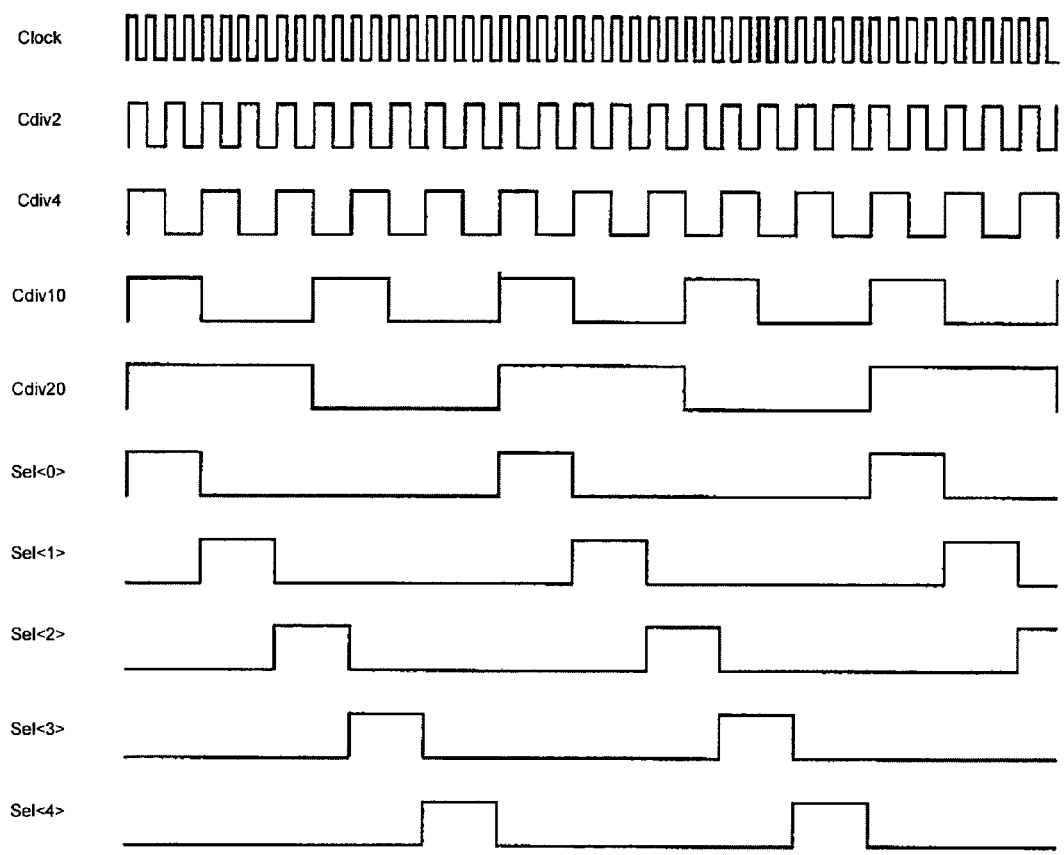
FIG. 5 is a timing diagram of a serializer according to the present invention.

FIG. 5 shows a timing diagram of clock signals used by an embodiment of the present invention as shown in FIG. 4. The input clock (Clock) is generally divided by 2 (e.g., by divider 451) to produce signal Cdiv2. Cdiv2 is generally divided by two (e.g., by divider 452) to produce signal Cdiv4. Cdiv4 is then generally divided by 5 (e.g., by divider 453) to produce Cdiv20 (e.g. for use in data bank 401) and five select signals Sel<4:0> (e.g., for use by multiplexer 402).

Referring again to FIG. 4, Data bank 401 may comprise flip-flops 419-410 and 419'-410', to store 20 data bits. Data bank 401 may be configured to sample 10 bits of data from the 10-bit parallel input (DataIn<9:0>) into flip-flops 419-410 on the rising edge of Cdiv20, and to sample another 10 bits of data from the 10-bit parallel input stream into flip-flops 419'-410', on the falling edge of Cdiv20 (i.e. the parallel input stream may be sampled at a frequency of f/10).

Multiplexer 402 may be configured to receive the 20 data bits at a frequency of f/20 (e.g., Cdiv20), and to produce the 4-bit data stream at a frequency of f/4 (e.g., Cdiv4). Multiplexer 402 may be further configured such that when signal Sel<0> is high the first 4 bits of data from the data bank (e.g., bits <3:0>) may be provided to tree-based serializer 403. When Sel<1> is high the subsequent 4 bits of data from the data bank (e.g., bits <7:4>) may be provided tree-based serializer 403. Similarly when Sel<2>, Sel<3> and Sel<4> are high then data (e.g., data bits <11:8>, <15:12>, and <19:16>, respectively) from the data bank may be provided to tree-based serializer 403.

An Exemplary Method

The present invention further relates to method for converting an M-bit parallel input stream into a corresponding serial data stream. The method generally includes the steps of (a) loading an M-bit parallel input stream into a data bank of M*y bits, where y is an integer of at least 1, (b) producing an N-bit parallel data stream, where N=$2^r$, r is an integer of at least 1, M*y=N*z, and z is an integer of at least 1, and (c) serializing z sequential samples of the N-bit parallel data stream in a tree-based serializer, where the tree-based serializer comprises r stages. In a further embodiment, the loading step may include loading y sequential samples of the M-bit parallel data stream.

In a preferred embodiment of the method, M may be 10, y may be 2, N may be 4, and z may be 5. In another exemplary embodiment, M may be 10, y may be 1, N may be 2, and z may be 5. In an alternative exemplary embodiment, M may be 10, y may be 4, N may be 8, and z may be 5. Generally, M may be any integer that is not a power of two, such as 3, 5, 6, or 10. For example, conventional encoders such as 4B/5B, 5B/6B, and 8B/10B encoders generally produce 5, 6, and 10-bit parallel data streams, respectively, which may be serialized according to embodiments of the method. N may generally be any number that is a power of two, such as 2, 4, or 8.

In a further embodiment of the method, the loading step may operate at a frequency of f/M. In another embodiment, the N-bit parallel data stream may have a frequency of f/N.

In another embodiment, each of the r stages may be labeled s, where $0 \leq s < r$. Each stage may comprise $2^s$ two-to-one multiplexers and $2^s$ flip-flops. In a further embodiment, each of the $2^s$ flip-flops of each of said stages operates at a frequency of $f/2^s$.

Power Consumption

Figure 6:
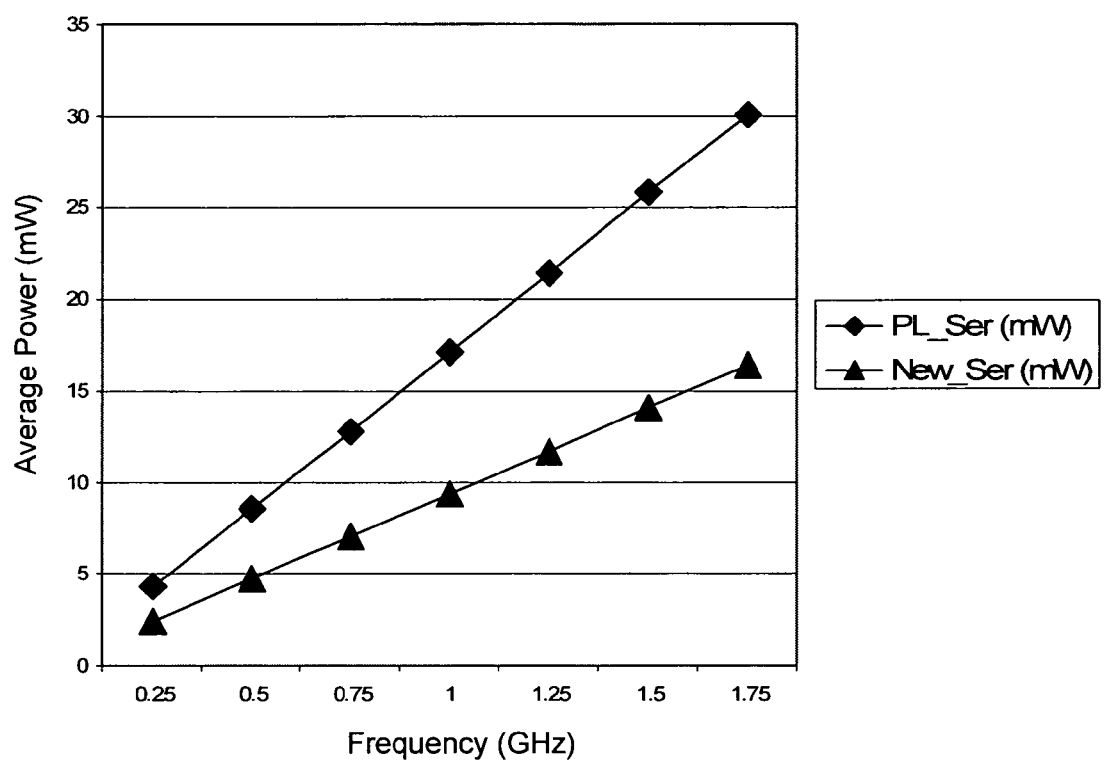
FIG. 6 is a graph of power consumed by a conventional parallel load and shift serializer and a serializer according to the present invention.

Table 1 and FIG. 6 show a comparison of power consumption between a conventional 10-bit load and shift serializer PL_Ser (e.g., serializer 100) and a 10-bit serializer according to the present invention New_Ser (e.g., serializer 400). Table 1 and FIG. 6 show the measured power consumption data and a plot of the average power vs. the frequency of the serial data stream. Both plots show a linear relationship between average power consumption and frequency. The serializer according to the present invention reduced power by 40-46%, which is a significant improvement. The designs as measured were implemented using full-swing CMOS static circuits.

TABLE 1

| Freq (GHz) | PL_Ser (mW) | New_Ser (mW) |
| --- | --- | --- |
| 0.25 | 4.3 | 2.4 |
| 0.50 | 8.5 | 4.7 |
| 0.75 | 12.8 | 7.0 |
| 1.00 | 17.1 | 9.4 |
| 1.25 | 21.4 | 11.7 |
| 1.50 | 25.8 | 14.1 |
| 1.75 | 30.1 | 16.4 |

Because serializers according to the present invention may comprise both a high speed section (e.g., the tree-based serializer section) and a lower speed section (e.g., the data bank and multiplexer sections), the high speed and lower speed sections may be implemented in different circuit styles and/or topologies. For example, high speed sections can be implemented using low-swing logic such as current-mode logic (CML) family components, and lower speed section may be implemented using more conventional full-swing CMOS components.

CONCLUSION/SUMMARY

Thus, the present invention provides circuits and a method for serialization of an M-bit parallel input stream, with low power requirements even where M is not a power of two. In particular, the present invention advantageously provides high speed and relatively low power serialization of 10-bit parallel data streams.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A serializer circuit for converting an M-bit parallel input stream into a corresponding serial data stream, said serial data stream having a frequency f, and said circuit comprising:
   a) a data bank of M*y data bits, where y is an integer of at least 1, said data bank configured to load y sequential samples of said M-bit parallel input stream;
   b) a multiplexer configured to receive said data bits, and to produce an N-bit parallel data stream, where N=$2^r$, r is an integer of at least 1, My=N*z, and z is an integer of at least 1;
   c) a tree-based serializer configured to receive said N-bit parallel data stream and to produce a corresponding serial data stream, said tree-based serializer comprising r stages.

2. The serializer circuit of claim 1, wherein M is at least 3.

3. The serializer circuit of claim 1, further comprising an encoder configured to
   a) receive a plurality of data bytes;
   b) encode each of said plurality of data bytes into an M-bit representation; and
   c) produce said M-bit parallel input stream from said M-bit representations.

4. The serializer circuit of claim 1, said data bank configured to load samples of said M-bit parallel input stream at a frequency of f/M.

5. The serializer circuit of claim 1, said multiplexer configured to load said data bits at a frequency of f/(M*y).

6. The serializer circuit of claim 1 said multiplexer configured to produce said N-bit parallel data stream at a frequency of f/N.

7. The serializer circuit of claim 1, further comprising:
   a) a clock signal operating at said frequency f,
   b) first to r-th sequentially coupled divide-by-two frequency dividers, said first divider coupled to said clock signal;
   c) a divide-by-z divider comprising an input coupled to said r-th divide-by-two divider.

8. The serializer circuit of claim 1, wherein each of said stages s ($0 \leq s < r$) comprises $2^s$ two-to-one multiplexers and $2^s$ flip-flops.

9. The serializer circuit of claim 8, wherein each of said $2^s$ flip-flops of each of said stages operates at a frequency of $f/2^s$.

10. A serializer circuit for converting 10-bit parallel input stream into a corresponding serial data stream, said serial data stream having a frequency f, and said circuit comprising:
   a) a data bank of 20 data bits, configured to load two sequential samples of said 10-bit parallel input stream;
   b) a multiplexer configured to receive said data bits, and to produce a 4-bit parallel data stream;

c) a tree-based serializer configured to receive said 4-bit parallel data stream and to produce a corresponding serial data stream, said tree-based serializer comprising two stages.

11. The serializer circuit of claim 10, further comprising an encoder configured to
   a) receive a plurality of 8-bit data;
   b) encode each of said plurality of 8-bit data into a 10-bit representation; and
   c) produce said 10-bit parallel input stream from said 10-bit representations.

12. The serializer circuit of claim 10, said data bank configured to load samples of said 10-bit parallel input stream at a frequency of f/10.

13. The serializer circuit of claim 10, said multiplexer configured to load said data bits at a frequency of f/20 and configured to produce said 4-bit parallel data stream at a frequency of f/4.

14. The serializer circuit of claim 10, further comprising:
   a) a clock signal operating at said frequency f.
   b) first and last sequentially coupled divide-by-two frequency dividers, said first divider coupled to said clock signal;
   c) a divide-by-5 divider comprising an input coupled to said last divide-by-two divider.

15. The serializer circuit of claim 10, wherein each of said two stages s (s=0,1) comprises $2^s$ two-to-one multiplexers and $2^s$ flip-flops.

16. The serializer circuit of claim 15, wherein each of said $2^s$ flip-flops of each of said stages operates at a frequency of $f/2^s$.

17. A method for converting an M-bit parallel input stream into a corresponding serial data stream, said serial data stream having a frequency f, and said method comprising the steps of:
   a) loading said M-bit parallel input stream into a data bank of M*y bits;
   b) producing an N-bit parallel data stream, where $N=2^r$, r is an integer of at least 1, M*y=N*z, and z is an integer of at least 1;
   c) serializing said N-bit parallel data stream in a tree-based serializer, said tree-based serializer comprising r stages.

18. The method of claim 17, wherein M is at least 3, said loading step operating at a frequency of f/M.

19. The method of claim 17, said N-bit parallel data stream having a frequency of f/N.

20. The method of claim 17, wherein each of said r stages s (0≦s<r) comprises $2^s$ two-to-one multiplexers and $2^s$ flip-flops, wherein each of said $2^s$ flip-flops of each of said stages operates at a frequency of $f/2^s$.

* * * * *